(12) United States Patent
Matsudai et al.

(10) Patent No.: US 11,152,466 B2
(45) Date of Patent: Oct. 19, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Tomoko Matsudai, Tokyo (JP); Yoko Iwakaji, Tokyo (JP); Takeshi Suwa, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 68 days.

(21) Appl. No.: 16/352,134

(22) Filed: Mar. 13, 2019

(65) Prior Publication Data

US 2020/0091290 A1 Mar. 19, 2020

(30) Foreign Application Priority Data

Sep. 19, 2018 (JP) .............................. JP2018-174503

(51) Int. Cl.
*H01L 29/06* (2006.01)
*H01L 29/10* (2006.01)
(Continued)

(52) U.S. Cl.
CPC ...... *H01L 29/0696* (2013.01); *H01L 29/1095* (2013.01); *H01L 29/66348* (2013.01); *H01L 29/7397* (2013.01)

(58) Field of Classification Search
CPC ............. H01L 29/0696; H01L 29/1095; H01L 29/7397; H01L 29/66348; H01L 29/32;
(Continued)

(56) References Cited

U.S. PATENT DOCUMENTS 7,825,449 B2  11/2010  Suzuki et al.
7,880,225 B2   2/2011  Matsuura et al.
(Continued)

FOREIGN PATENT DOCUMENTS

JP   3934613 B2   6/2007
JP   4798119 B2  10/2011
(Continued)

*Primary Examiner* — Steven H Loke
*Assistant Examiner* — Juanita B Rhodes (57) ABSTRACT

A semiconductor device includes a semiconductor body; a first electrode on the semiconductor body; control electrodes provided in the semiconductor body along the surface thereof; and first films electrically insulating the control electrodes from the semiconductor body. The semiconductor body includes first, third, sixth layers of a first conductivity type, and second, fourth, fifth layers of a second conductivity type. The second to sixth layers are provided between the first electrode and the first layer. The second and third layers are positioned between two adjacent control electrodes. The fourth to sixth layers are positioned between other two adjacent control electrodes. The sixth layer positioned between the fourth layer and the fifth layer. The sixth layer includes a major portion and a boundary portion between the major portion and one of the first films. An impurity concentration in the boundary portion is lower than that in the major portion.

8 Claims, 9 Drawing Sheets

(51) Int. Cl.
*H01L 29/739* (2006.01)
*H01L 29/66* (2006.01)

(58) Field of Classification Search
CPC .............. H01L 29/8613; H01L 29/407; H01L 29/7395; H01L 29/0684; H01L 29/36
See application file for complete search history.

(56) References Cited

U.S. PATENT DOCUMENTS

| | | | |
|---|---|---|---|
| 2005/0156201 A1 | 7/2005 | Matsuda | |
| 2013/0240947 A1* | 9/2013 | Matsudai | ............ H01L 29/7813 257/139 |
| 2016/0064536 A1* | 3/2016 | Tanaka | ................ H01L 29/0696 257/139 |
| 2017/0025522 A1* | 1/2017 | Naito | .................... H01L 29/407 |
| 2017/0278957 A1 | 9/2017 | Hikasa | |
| 2018/0294258 A1* | 10/2018 | Kamibaba | ............ H01L 29/401 |
| 2019/0019861 A1 | 1/2019 | Naito | |
| 2019/0228973 A1 | 7/2019 | Kimura | |

FOREIGN PATENT DOCUMENTS

| | | |
|---|---|---|
| JP | 5232377 B2 | 7/2013 |
| JP | 2017-183346 A | 10/2017 |
| JP | 2019-021891 A | 2/2019 |
| JP | 2019-129250 A | 8/2019 |

\* cited by examiner

FIG. 9 ature of the switching speed to be fast.
SEMICONDUCTOR DEVICE

CROSS-REFERENCE TO RELATED APPLICATIONS

This application is based upon and claims the benefit of priority from Japanese Patent Application No. 2018-174503, filed on Sep. 19, 2018; the entire contents of which are incorporated herein by reference.

FIELD

Embodiments relate to a semiconductor device.

BACKGROUND

For example, an insulated gate bipolar transistor (IGBT) is known as a semiconductor device having a breakdown voltage of 600 V or more. Because such a semiconductor device is used in, for example, a power converter, it is desirable for both the steady loss and the switching loss to be low, that is, for the ON-resistance to be low and the switching speed to be fast.

For example, in an IGBT having a trench gate structure, it is favorable for the gate electrodes to extend from the channel region to a deep position inside the $n^-$-type base layer. Thereby, it is possible for carriers to accumulate efficiently in the $n^-$-type base layer between mutually-adjacent gate electrodes; and the ON-resistance can be reduced. However, when the ON-resistance is reduced by the carriers accumulating inside the $n^-$-type base layer, the carrier amount that is discharged at turn-off also is high. Therefore, the turn-off time lengthens; and the switching loss increases. That is, there is a trade-off relationship between the reduction of the steady loss and the reduction of the switching loss.

DETAILED DESCRIPTION

According to an embodiment, a semiconductor device includes a semiconductor body including a first semiconductor layer of a first conductivity type; a first electrode provided on a front surface of the semiconductor body; a second electrode provided on a back surface of the semiconductor body; a plurality of control electrodes provided in the semiconductor body; and a plurality of first insulating films electrically insulating the plurality of control electrodes from the semiconductor body. The plurality of control electrodes extend in a first direction from the first electrode toward the second electrode. The plurality of control electrodes are arranged in a second direction along the front surface of the semiconductor body. The semiconductor body includes a second semiconductor layer of a second conductivity type, a third semiconductor layer of the first conductivity type, a fourth semiconductor layer of the second conductivity type, a fifth semiconductor layer of the second conductivity type, and a sixth semiconductor layer. The second semiconductor layer is provided between the first electrode and the first semiconductor layer. The second semiconductor layer is positioned between two adjacent control electrodes of the plurality of control electrodes. The third semiconductor layer is selectively provided between the first electrode and the second semiconductor layer. The fourth semiconductor layer is provided between the first electrode and the first semiconductor layer. The fourth semiconductor layer is provided between other two adjacent control electrodes of the plurality of control electrodes. The fifth semiconductor layer is provided between the first electrode and the fourth semiconductor layer. The sixth semiconductor layer is provided between the fourth semiconductor layer and the fifth semiconductor layer. The sixth semiconductor layer includes first-conductivity-type impurities. The sixth semiconductor layer includes a major portion and a boundary portion. The major portion is positioned between the fourth semiconductor layer and the fifth semiconductor layer. The boundary portion is positioned between the major portion and one of the plurality of first insulating films. A first-conductivity-type impurity concentration of the boundary portion is lower than a first-conductivity-type impurity concentration of the major portion.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Moreover, symbols "$n^+$", "n" and "$n^-$" indicate the n-type semiconductors, and the n-type impurity concentrations thereof are set to be lower in this order. Symbols "$p^+$", "p" and "$p^-$" indicate the p-type semiconductors, and the p-type impurity concentrations thereof are set to be lower in this order.

First Embodiment

Figure 1:
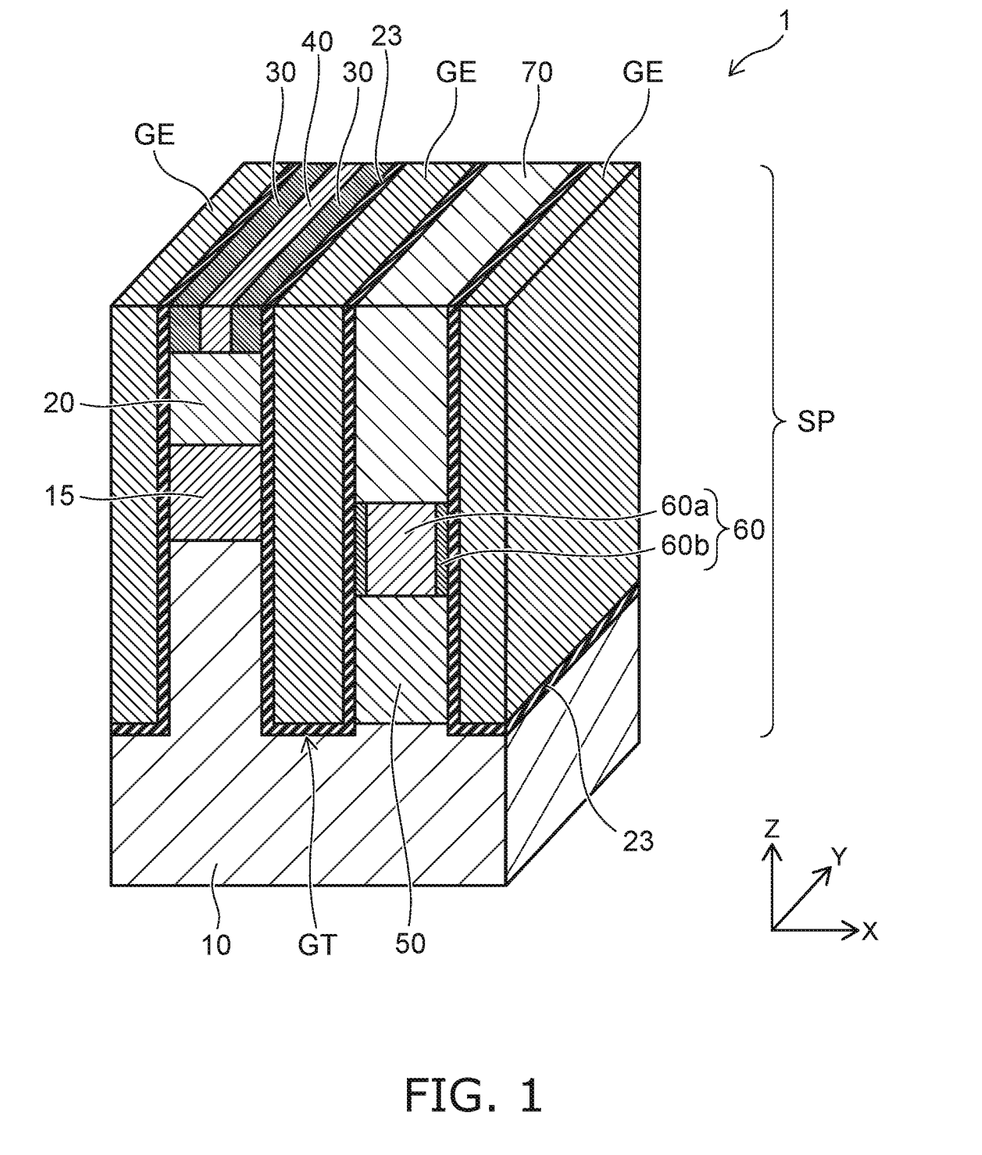
FIG. 1 is a perspective view schematically showing a semiconductor device according to a first embodiment.
Figure 2:
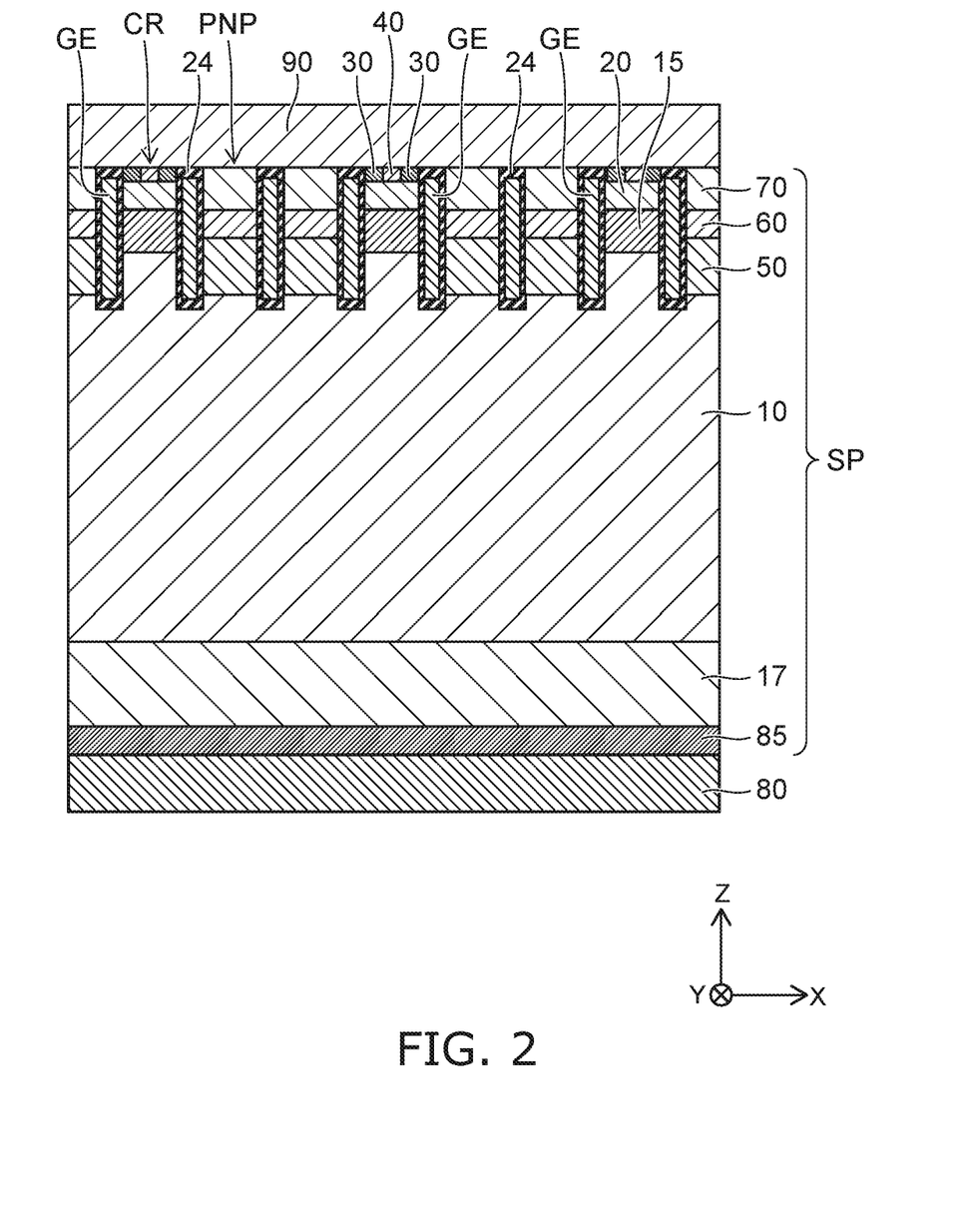
FIG. 2 is a schematic cross-sectional view showing the semiconductor device according to the first embodiment.

FIG. 1 and FIG. 2 are schematic views showing a semiconductor device 1 according to a first embodiment. The semiconductor device 1 is, for example, an IGBT. FIG. 1 is a perspective view schematically showing the main portions of the semiconductor device 1. FIG. 2 is a schematic cross-sectional view showing the structure of the semiconductor device 1.

As shown in FIG. 1, the semiconductor device 1 includes a semiconductor body SP and gate electrodes GE. The gate electrodes GE are provided in the interiors of gate trenches GT formed inside the semiconductor body SP. For example, the gate trenches GT are dug in the direction (the −Z direction) from the front surface toward the back surface of the semiconductor body SP and extend in the Y-direction along the front surface of the semiconductor body SP. For example, the gate trenches GT are arranged in the X-direction. For example, the gate electrodes GE are filled into the interiors of the gate trenches GT and are provided in plate configurations extending in the Y-direction and the Z-direction.

The semiconductor body SP includes an n$^-$-type base layer 10, an n-type barrier layer 15, a p-type base layer 20, an n-type emitter layer 30, and a p$^+$-type contact layer 40. The gate trenches GT have depths reaching the interior of the n$^-$-type base layer 10 from the front surface of the semiconductor body SP; and the n-type barrier layer 15, the p-type base layer 20, the n-type emitter layer 30, and the p$^+$-type contact layer 40 are provided between the gate electrodes GE adjacent to each other in the X-direction.

The n-type barrier layer 15 is provided on the n$^-$-type base layer 10; and the p-type base layer 20 is provided on the n-type barrier layer 15. The n-type emitter layer 30 and the p$^+$-type contact layer 40 are provided selectively on the p-type base layer 20 and are arranged alternately in, for example, the Y-direction. The gate electrode GE is provided to oppose the n$^-$-type base layer 10, the n-type barrier layer 15, and the p-type base layer 20 with a gate insulating film 23 interposed.

The semiconductor body SP further includes a p-type semiconductor layer 50, an n-type semiconductor layer 60, and a p-type semiconductor layer 70. The p-type semiconductor layer 50, the n-type semiconductor layer 60, and the p-type semiconductor layer 70 are provided in a region between the gate electrodes GE where the p-type base layer 20 is not provided. The p-type semiconductor layer 50 is provided on the n$^-$-type base layer 10; and the n-type semiconductor layer 60 is provided on the p-type semiconductor layer 50. The p-type semiconductor layer 70 is provided on the n-type semiconductor layer 60. The gate electrode GE is disposed to oppose the p-type semiconductor layer 50, the n-type semiconductor layer 60, and the p-type semiconductor layer 70 with other gate insulating film 23 interposed.

The n-type semiconductor layer 60 further includes a major portion 60$a$ and a boundary portion 60$b$. The major portion 60$a$ includes an n-type impurity having a high concentration; and the boundary portion 60$b$ includes a lower concentration of the n-type impurity than the major portion 60$a$. The boundary portion 60$b$ is positioned between the gate insulating film 23 and the major portion 60$a$. The major portion 60$a$ and the boundary portion 60$b$ contact the p-type semiconductor layers 50 and 70.

As shown in FIG. 2, the semiconductor body SP is disposed between a collector electrode 80 and an emitter electrode 90. The collector electrode 80 is disposed on the backside of the semiconductor body SP. The emitter electrode 90 is disposed on the front surface side of the semiconductor body SP and contacts the n-type emitter layer 30, the p$^+$-type contact layer 40, and the p-type semiconductor layer 70. The collector electrode 80 and the emitter electrode 90 are, for example, metal layers including at least one selected from the group consisting of aluminum (Al), titanium (Ti), nickel (Ni), tungsten (W), and gold (Au). The emitter electrode 90 may be, for example, a conductive polysilicon layer.

The semiconductor body SP further includes an n-type buffer layer 17 and a p-type collector layer 85. The p-type collector layer 85 is positioned between the n$^-$-type base layer 10 and the collector electrode 80. The n-type buffer layer 17 is provided between the n$^-$-type base layer 10 and the p-type collector layer 85. The n-type buffer layer 17 includes a higher concentration of the n-type impurity than the n$^-$-type base layer 10. Also, the n-type buffer layer 17 may be formed as one body with the n$^-$-type base layer 10.

The material of the semiconductor body SP is, for example, silicon (Si). The material of the semiconductor body SP is not limited thereto; for example, a semiconductor such as silicon carbide (SiC) or the like may be used. The gate trenches GT have depths reaching the n$^-$-type base layer 10 from the front surface of the semiconductor body SP. For example, the depths of the gate trenches GT are 1 to 10 μm. For example, the gate trenches GT are arranged in the X-direction at a spacing of 0.1 to several μm.

The gate electrodes GE are disposed in the interiors of the gate trenches GT and are electrically insulated from the n$^-$-type base layer 10, the n-type barrier layer 15, the p-type base layer 20, the n-type emitter layer 30, the p$^+$-type contact layer 40, the p-type semiconductor layer 50, the n-type semiconductor layer 60, and the p-type semiconductor layer 70 by the gate insulating films 23. Also, the gate electrodes GE are electrically insulated from the emitter electrode 90 by inter-layer insulating films 24.

The gate insulating film 23 and the inter-layer insulating film 24 are, for example, silicon oxide films ($SiO_2$). The materials of the gate insulating film 23 and the inter-layer insulating film 24 are not limited thereto; for example, the material of the gate insulating film 23 and the material of the inter-layer insulating film 24 may be different. The gate electrode GE is, for example, polysilicon including an n-type or p-type impurity. Also, the material of the gate electrode GE may be a metal.

The n$^-$-type base layer 10 is, for example, a semiconductor layer having an n-type impurity concentration of $1\times10^{12}$ to $1\times10^{15}$ cm$^{-3}$. For example, the n$^-$-type base layer 10 has a layer thickness of 1 to 1000 μm. The n-type impurity concentration and the layer thickness of the n$^-$-type base layer 10 are set to obtain a prescribed element breakdown voltage.

The n-type barrier layer 15 has an n-type impurity concentration that is higher than the n-type impurity concentration of the n$^-$-type base layer 10. For example, the n-type barrier layer 15 includes the n-type impurity having a dose amount in a range of $1\times10^{12}$ to $1\times10^{14}$ cm$^{-2}$. The layer thickness of the n-type barrier layer 15 is, for example, about 0.1 to several μm.

For example, the p-type base layer 20 includes a p-type impurity having a dose amount in a range of $1\times10^{12}$ to $1\times10^{14}$ cm$^{-2}$. The layer thickness of the p-type base layer 20 is, for example, about 0.1 to several μm. The p-type base layer 20 is electrically connected to the emitter electrode 90 via the p$^+$-type contact layer 40.

The n-type emitter layer 30 has an n-type impurity concentration that is higher than the n-type impurity concentration of the n$^-$-type base layer 10. For example, the n-type emitter layer 30 includes the n-type impurity having a dose amount in a range of $1\times10^{14}$ to $1\times10^{16}$ cm$^{-2}$. The layer thickness of the n-type emitter layer 30 is, for example, 0.1 to several μm.

The p$^+$-type contact layer 40 includes a p-type impurity having a higher concentration than the p-type impurity concentration of the p-type base layer 20. For example, the p$^+$-type contact layer 40 includes the p-type impurity having a dose amount in a range of $1\times10^{14}$ to $1\times10^{16}$ cm$^{-2}$. The layer thickness of the p$^+$-type contact layer 40 is, for example, 0.1 to several μm.

For example, the p-type collector layer 85 includes the p-type impurity having a dose amount in a range of $1\times10^{13}$ to $1\times10^{15}$ cm$^{-2}$. The layer thickness of the p-type collector layer 85 is, for example, 0.1 to 10 μm.

The semiconductor device 1 includes a channel region CR and a PNP region. The channel region CR is provided between the gate electrodes GE and includes the p-type base layer 20 and the n-type emitter layer 30. The PNP region includes the p-type semiconductor layer 50, the n-type semiconductor layer 60, and the p-type semiconductor layer 70 between the gate electrodes GE. For example, the channel regions CR and the PNP regions are arranged alternately in the X-direction. As shown in FIG. 2, multiple PNP regions may be disposed between the channel regions CR adjacent to each other in the X-direction. Or, multiple channel regions CR may be disposed between the PNP regions adjacent to each other in the X-direction.

Figure 3:
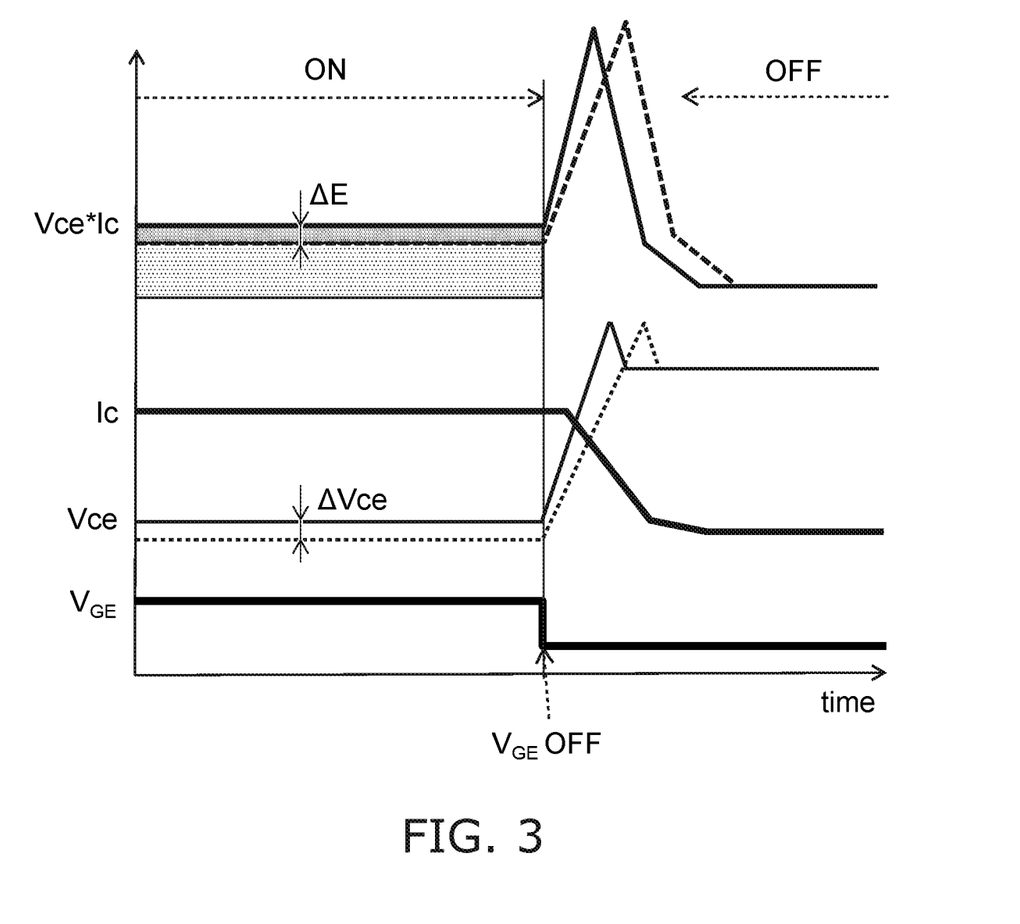
FIG. 3 is a schematic view showing the operations of the semiconductor device according to the first embodiment.

Operations of the semiconductor device 1 will now be described with reference to FIG. 2 and FIG. 3. FIG. 3 is a time chart showing the operations of the semiconductor device 1 according to the first embodiment.

For example, in a steady state in which the semiconductor device 1 is turned ON, a positive drive signal (gate voltage $V_{GE}$) that exceeds a threshold is applied to the gate electrode GE. Thereby, an n-type channel is formed at the interface between the p-type base layer 20 and the gate insulating film 23 in the channel region CR; and conduction occurs among the n$^-$-type base layer 10, the n-type barrier layer 15, and the n-type emitter layer 30. As a result, electrons are injected into the n$^-$-type base layer 10. Therefore, the p-type collector layer 85 has a forward bias with respect to the n$^-$-type base layer 10; holes are injected into the n$^-$-type base layer 10 from the p-type collector layer 85; and the state is set to the ON-state. The holes that are injected at this time travel through the n$^-$-type base layer 10 and flow into the p-type base layer 20.

Further, an n-type accumulation layer is formed at the interface between the n$^-$-type base layer 10 and the gate insulating film 23. The hole injection from the p-type collector layer 85 into the n$^-$-type base layer 10 is promoted to balance the negative charge of the n-type accumulation layer; and the carrier amount inside the n$^-$-type base layer 10 increases. As a result, the ON-resistance in the turned-on state of the semiconductor device 1 is reduced.

The p-type impurity concentrations of the p-type semiconductor layer 50 and the p-type semiconductor layer 70 in the PNP region are set to concentrations such that n-type channels are not formed at the interfaces between the p-type semiconductor layer 50 and the gate insulating film 23 and between the p-type semiconductor layer 70 and the gate insulating film 23 even when a positive drive signal (gate voltage $V_{GE}$) exceeding the threshold is applied to the gate electrode GE. Thereby, n-type channels do not conduct in the PNP region. However, slight leakage currents are generated at the junction portions of the PNP region; and a collector-emitter voltage Vce increases slightly compared to the case where the PNP region is not provided, which is shown by a broken line in FIG. 3. Therefore, an increment ΔE of the energy loss (Vce*Ic) corresponding to an increment ΔVce of Vce occurs.

In the semiconductor device 1, by providing the major portion 60a including the n-type impurity having the high concentration in the n-type semiconductor layer 60, the leakage currents at the junction portions of the PNP region can be suppressed; and the increase of Vce and the increase ΔE of Vce*Ic in the turned-on state can be suppressed.

Then, when the semiconductor device 1 is turned OFF, the gate voltage $V_{GE}$ that is applied to the gate electrode GE is lowered to a drive signal that is lower than the threshold (hereinafter, referred to as "switched OFF"). At this time, the gate voltage $V_{GE}$ is reduced to be the threshold of the channel region CR or less; and a negative potential is applied to the gate electrode GE. Thereby, the n-type channel of the channel region CR and the n-type accumulation layer at the interface between the n$^-$-type base layer 10 and the gate insulating film 23 disappear. As a result, injection of the electrons into the n$^-$-type base layer 10 via the n-type channel stops; and the semiconductor device 1 is turned OFF.

However, a collector current Ic flows until the carriers accumulated in the n$^-$-type base layer 10 are discharged to the collector electrode 80 and the emitter electrode 90; therefore, a time delay (a turn-off time) occurs from the gate voltage $V_{GE}$ being switched OFF until the semiconductor device 1 is turned OFF.

As shown in FIG. 3, when the gate voltage $V_{GE}$ is switched OFF, the decrease of the collector current Ic starts; and when the collector current Ic decreases to a constant level, the semiconductor device 1 reaches the turned-off state. Meanwhile, Vce*Ic increases as Vce increases. Subsequently, the collector current Ic decreases; and Vce*Ic decreases and reaches the zero level in the turned-off state. The integral of Vce*Ic in the turn-off period is the switching loss.

In the semiconductor device 1, a p-type channel is formed at the interface between the n-type semiconductor layer 60 and the gate insulating film 23 of the PNP region by applying the negative potential to the gate electrode GE. Thereby, conduction occurs between the p-type semiconductor layer 50 and the p-type semiconductor layer 70; and the discharge of the holes to the emitter electrode 90 can be promoted. Thereby, compared to the case where the PNP region is not provided, the turn-off time can be shortened; and the switching loss can be reduced.

In the semiconductor device 1, the absolute value of the threshold at which the p-type channel is formed can be reduced by providing the boundary portion 60b having the low n-type impurity concentration at the portion where the n-type semiconductor layer 60 contacts the gate insulating film 23.

For example, when the gate voltage $V_{GE}$ applied to the gate electrode GE is changed from the positive potential to the negative potential, due to the Miller effect corresponding to the gate capacitance, a constant amount of time is necessary until the gate potential becomes the threshold at which the p-type channel is formed or less. By providing the boundary portion 60b in the semiconductor device 1, the absolute value of the threshold value can be small; and it is possible to shorten the time until the p-type channel is formed. Thereby, the turn-off time can be shortened; and the switching loss can be reduced.

Figure 4:
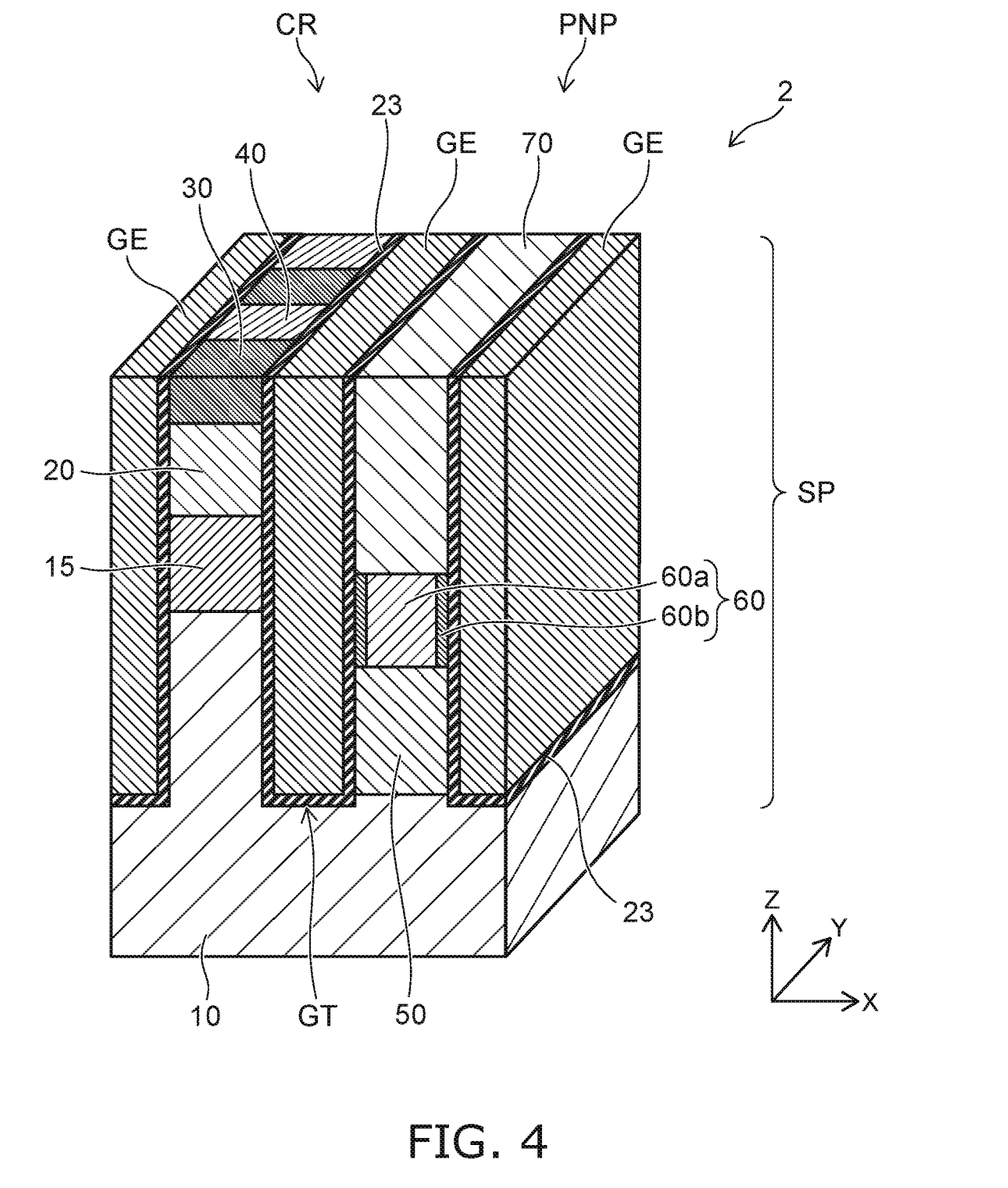
FIG. 4 is a perspective view schematically showing a semiconductor device according to a modification of the first embodiment.

FIG. 4 is a perspective view schematically showing a semiconductor device 2 according to a modification of the first embodiment. In the semiconductor device 2, the arrangement of the n-type emitter layer 30 and the p⁺-type contact layer 40 in the channel region CR is different from that of the semiconductor device 1.

As shown in FIG. 4, the n-type emitter layer 30 and the p⁺-type contact layer 40 are arranged alternately in the extension direction of the gate trench along the front surface of the semiconductor body SP. The n-type emitter layer 30 and the p⁺-type contact layer 40 are provided to oppose, with the gate insulating films 23 interposed, the gate electrodes GE disposed on the two sides in the X-direction.

The arrangement of the n-type emitter layer 30 and the p⁺-type contact layer 40 shown in FIG. 1 and FIG. 4 are examples; and the embodiments are not limited thereto. The following FIG. 5 to FIG. 9 illustrate examples including the same arrangement of the n-type emitter layer 30 and the p⁺-type contact layer 40 as FIG. 1 but are not limited thereto. For example, the arrangement of the n-type emitter layer 30 and the p⁺-type contact layer 40 shown in FIG. 4 also is applicable to the embodiments shown in FIG. 5 to FIG. 9.

Figure 5:
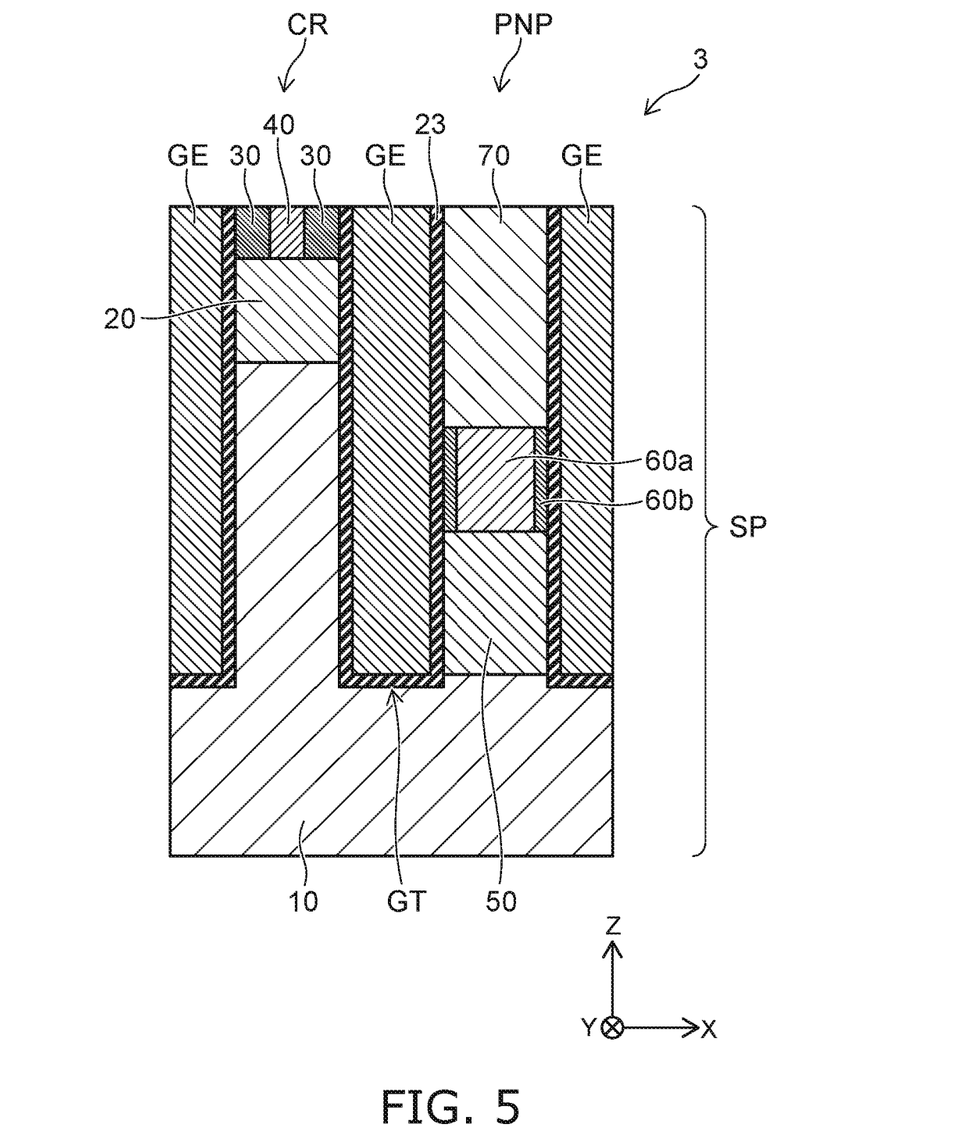
FIG. 5 is a schematic cross-sectional view showing a semiconductor device according to other modification of the first embodiment.

FIG. 5 is a schematic cross-sectional view showing a semiconductor device 3 according to other modification of the first embodiment. In the semiconductor device 3, the n-type barrier layer 15 is not provided in the channel region CR; and the p-type base layer 20 is provided directly on the n⁻-type base layer 10.

When the semiconductor device 3 is turned ON, the n-type accumulation layer that is formed at the interface between the n⁻-type base layer 10 and the gate insulating film 23 extends to the vicinity of the p-type base layer 20. Thereby, the hole injection from the p-type collector layer 85 into the n⁻-type base layer 10 is promoted; and a low ON-resistance is obtained. Such a structure in which the n-type barrier layer 15 is not provided is applicable also to the embodiments shown below in FIG. 6 to FIG. 9.

Second Embodiment

Figure 6:
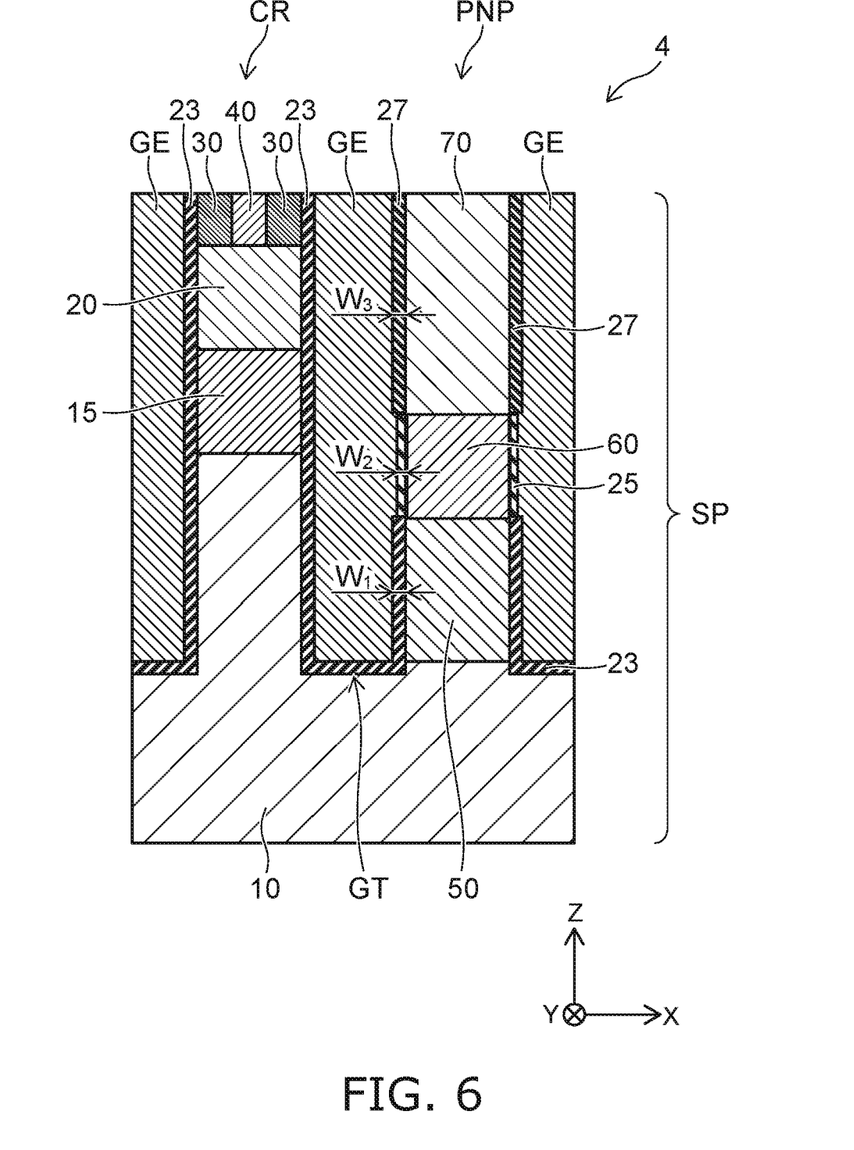
FIG. 6 is a schematic cross-sectional view showing a semiconductor device according to a second embodiment.

FIG. 6 is a schematic cross-sectional view showing a semiconductor device 4 according to a second embodiment. In the semiconductor device 4, in the PNP region, a gate insulating film 25 is provided between the n-type semiconductor layer 60 and the gate electrode GE; and a gate insulating film 27 is provided between the p-type semiconductor layer 70 and the gate electrode GE.

For example, a thickness $W_2$ of the gate insulating film 25 is thinner than a thickness $W_1$ of the gate insulating film 23. Thereby, the absolute value of the threshold voltage for forming the p-type channel at the interface between the gate insulating film 25 and the n-type semiconductor layer 60 can be reduced. In other words, it is possible to increase the concentration of the n-type impurity of the n-type semiconductor layer 60, suppress the leakage current in the turned-on state, easily form the p-type channel at turn-off, and shorten the turn-off time. Thereby, both the steady loss and the switching loss can be reduced.

It is sufficient for the gate insulating film 27 to have a thickness $W_3$ at which dielectric breakdown does not occur for the voltage applied between the gate electrode GE and the p-type semiconductor layer 70; for example, in the case where the gate insulating film 27 is formed as one body with the gate insulating film 25, the gate insulating film 27 has substantially the same thickness as the gate insulating film 25.

Third Embodiment

Figure 7:
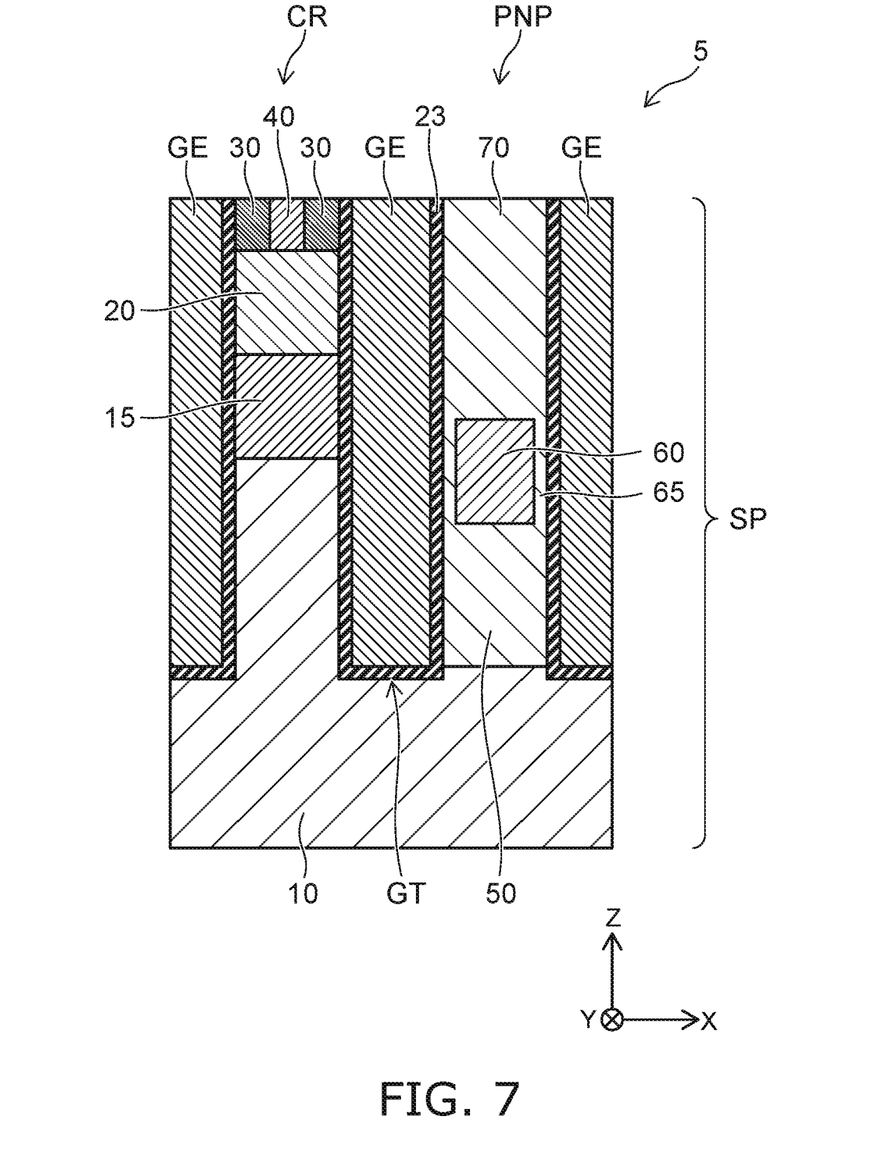
FIG. 7 is a schematic cross-sectional view showing a semiconductor device according to a third embodiment.

FIG. 7 is a schematic cross-sectional view showing a semiconductor device 5 according to a third embodiment. In the semiconductor device 5, a p-type region 65 is provided between the gate insulating film 23 and the n-type semiconductor layer 60 of the PNP region. For example, the p-type region 65 includes an n-type impurity having a lower concentration than the n-type impurity of the n-type semiconductor layer 60, and further includes a p-type impurity having a higher concentration than the n-type impurity.

The p-type region 65 is provided to contact the gate insulating film 23 and to be connected to the p-type semiconductor layer 50 and the p-type semiconductor layer 70. The concentration of the p-type impurity of the p-type region 65 is such that inversion to the n-type occurs when a positive gate voltage $V_{GE}$ is applied to the gate electrode GE; and the thickness of the p-type region 65 is such that the region that is inverted to the n-type is connected to the n-type semiconductor layer 60.

In the turned-on state of the semiconductor device 5, the p-type region 65 becomes an n-type inversion layer; and the leakage current is suppressed in the PNP region as well as in the n-type semiconductor layer 60 having the high concentration. On the other hand, at turn-off, the holes are discharged from the n⁻-type base layer 10 to the emitter electrode 90 via the p-type semiconductor layer 50, the p-type region 65, and the p-type semiconductor layer 70; and the turn-off time can be shortened. Thereby, both the steady loss and the switching loss can be reduced.

Fourth Embodiment

Figure 8:
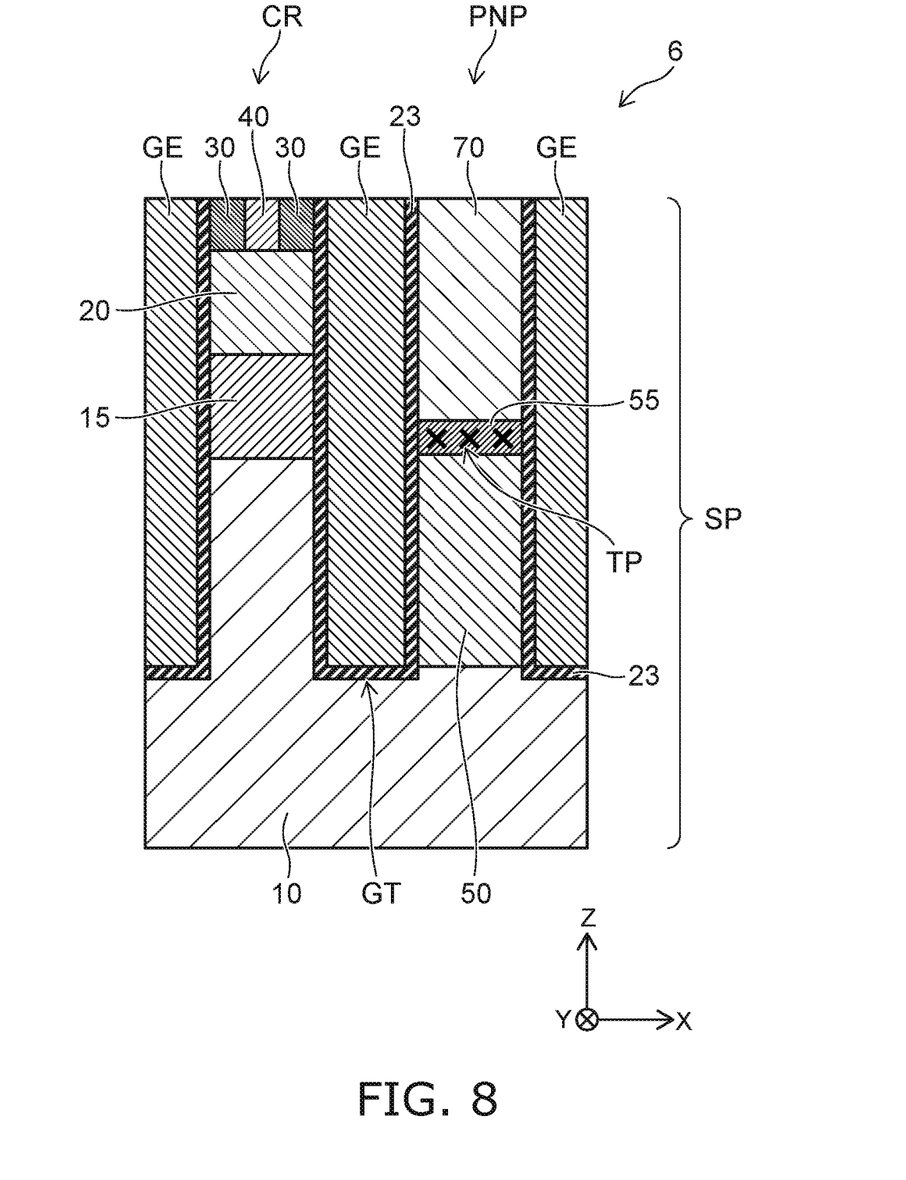
FIG. 8 is a schematic cross-sectional view showing a semiconductor device according to a fourth embodiment.

FIG. 8 is a schematic cross-sectional view showing a semiconductor device 6 according to a fourth embodiment. The semiconductor device 6 includes an n-type semiconductor layer 55 provided in the PNP region. The n-type semiconductor layer 55 includes defects forming a trap level TP for holes.

The n-type semiconductor layer 55 is provided in the semiconductor device 6 so that when a negative potential is applied to the gate electrode GE, a p-type channel is formed at the interface between the gate insulating film 23 and the n-type semiconductor layer 55; and conduction occurs between the p-type semiconductor layer 50 and the p-type semiconductor layer 70. Thereby, at turn-off, the discharge of the holes is promoted; and the turn-off time can be shortened. On the other hand, in the turned-on state, the leakage currents at the junction portions of the PNP region can be suppressed by the hole traps inside the n-type semiconductor layer 55.

Fifth Embodiment

Figure 9:
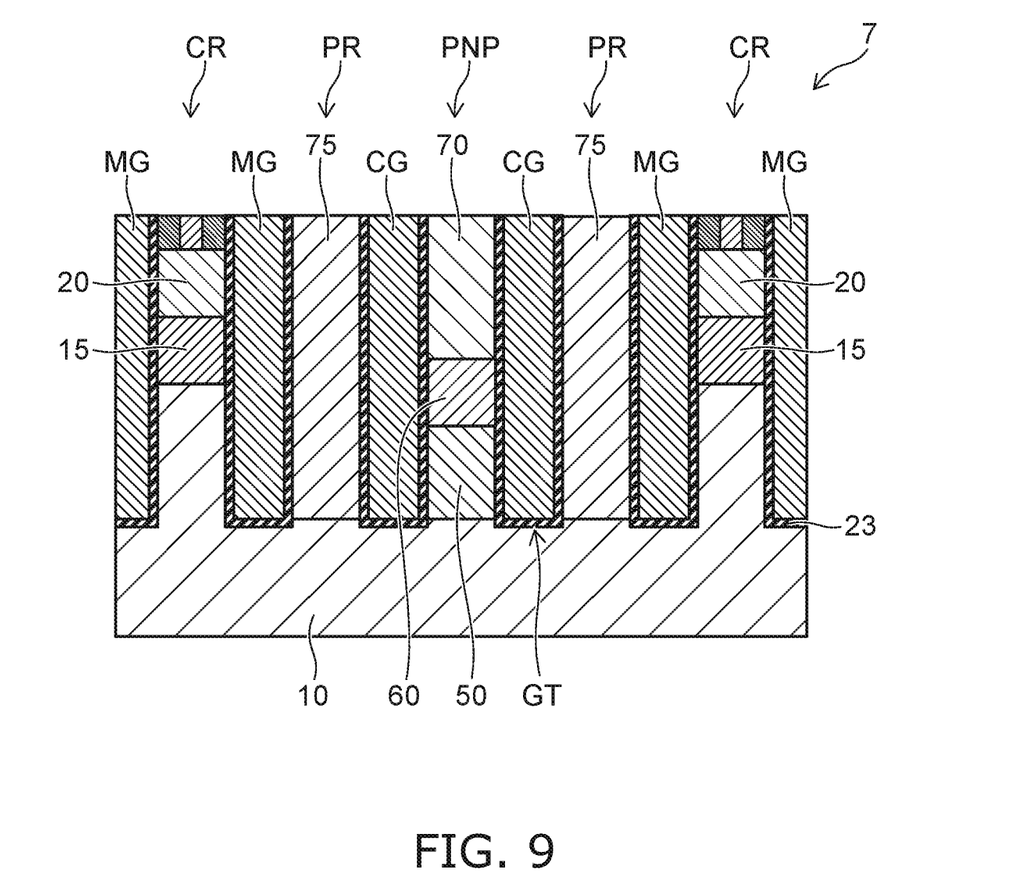
FIG. 9 is a schematic cross-sectional view showing a semiconductor device according to a fifth embodiment.

FIG. 9 is a schematic cross-sectional view showing a semiconductor device 7 according to a fifth embodiment. In the semiconductor device 7, the PNP region and two P-regions PR are provided between two channel regions CR adjacent to each other in the X-direction. The PNP region is disposed between the two P-regions PR.

A p-type semiconductor layer 75 is disposed in the P-region PR. The PNP region includes the p-type semiconductor layer 50, the n-type semiconductor layer 60, and the p-type semiconductor layer 70. For example, the PNP region may have any structure described with reference to FIG. 1 and FIG. 6 to FIG. 8.

The semiconductor device 7 further includes a first gate electrode MG and a second gate electrode CG. The first gate electrode MG is positioned between the channel region CR and the P-region PR; and the second gate electrode CG is positioned between the P-region PR and the PNP region.

The second gate electrode CG is controlled independently of the first gate electrode MG; for example, at turn-off, the second gate electrode CG is switched from the positive potential to the negative potential before the timing of the positive gate voltage $V_{GE}$ applied to the first gate electrode MG being switched OFF; and conduction is caused between the p-type semiconductor layer 50 and the p-type semiconductor layer 70 of the PNP region. Thereby, the discharge of the holes at turn-off can be promoted; and the switching loss can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor body including a first semiconductor layer of a first conductivity type;
   a first electrode provided on a front surface of the semiconductor body;
   a second electrode provided on a back surface of the semiconductor body;
   a plurality of control electrodes provided in the semiconductor body, the plurality of control electrodes extending in a first direction from the first electrode toward the second electrode, and being arranged in a second direction along the front surface of the semiconductor body; and
   a plurality of first insulating films electrically insulating the plurality of control electrodes from the semiconductor body, the semiconductor body including a second semiconductor layer of a second conductivity type provided between the first electrode and the first semiconductor layer, the second semiconductor layer being positioned between two adjacent control electrodes of the plurality of control electrodes, a third semiconductor layer of the first conductivity type selectively provided between the first electrode and the second semiconductor layer, a fourth semiconductor layer of the second conductivity type provided between the first electrode and the first semiconductor layer, the fourth semiconductor layer being provided between other two adjacent control electrodes of the plurality of control electrodes, a fifth semiconductor layer of the second conductivity type provided between the first electrode and the fourth semiconductor layer, and a sixth semiconductor layer provided between the fourth semiconductor layer and the fifth semiconductor layer, the sixth semiconductor layer including a first-conductivity-type impurity,
   the sixth semiconductor layer including a major portion and a boundary portion, the major portion being positioned between the fourth semiconductor layer and the fifth semiconductor layer, the boundary portion being positioned between the major portion and one of the plurality of first insulating films, a first-conductivity-type impurity concentration of the boundary portion being lower than a first-conductivity-type impurity concentration of the major portion.

2. The device according to claim 1, further comprising a plurality of second insulating films provided respectively between the first electrode and the plurality of control electrodes, the plurality of control electrodes being electrically insulated from the first electrode by the plurality of second insulating films, the first electrode being electrically connected to the third semiconductor layer and the fifth semiconductor layer.

3. The device according to claim 1, wherein the sixth semiconductor layer further includes a second-conductivity-type impurity in the boundary portion, and
   the first-conductivity-type impurity concentration in the boundary portion is lower than a concentration of the second-conductivity-type impurity in the boundary portion.

4. The device according to claim 1, wherein the semiconductor body further includes a seventh semiconductor layer of the second conductivity type positioned between the first semiconductor layer and the second electrode.

5. The device according to claim 4, wherein the semiconductor body further includes an eighth semiconductor layer of the first conductivity type positioned between the first semiconductor layer and the seventh semiconductor layer, the eighth semiconductor layer including a first-conductivity-type impurity having a higher concentration than a first-conductivity-type impurity concentration of the first semiconductor layer.

6. The device according to claim 1, wherein the semiconductor body further includes a ninth semiconductor barrier layer of the first conductivity type provided between the first semiconductor layer and the second semiconductor layer, the ninth semiconductor barrier layer including a first-conductivity-type impurity having a higher concentration than a first-conductivity-type impurity of the first semiconductor layer.

7. The device according to claim 1, wherein
   the plurality of control electrodes extends in a third direction crossing the second direction, the third direction being along the front surface of the semiconductor body,
   the semiconductor body further includes a contact layer of the second conductivity type including a second-conductivity-type impurity having a higher concentration than a second-conductivity-type impurity of the second semiconductor layer, the contact layer being selectively provided between the second semiconductor layer and the first electrode, the contact layer being arranged alternately with the third semiconductor layer in the third direction, and
   the first electrode is electrically connected to the third semiconductor layer, the fifth semiconductor layer, and the contact layer.

8. The device according to claim 1, wherein the semiconductor body includes a first region and a second region, the first region including the second semiconductor layer and the third semiconductor layer, the first region being positioned between the two adjacent control electrodes, the second region including the fourth semiconductor layer, the fifth semiconductor layer, and the sixth semiconductor layer, the second region being positioned between the other two control electrodes, the first region and the second region are provided respectively in a plurality, and two or more of the second regions are disposed between two of the first regions adjacent to each other in the second direction.

* * * * *